(12) United States Patent
Low et al.

(10) Patent No.: US 12,640,185 B2
(45) Date of Patent: May 26, 2026

(54) STROBE DELAY CALIBRATION FOR UNMATCHED RECEIVE MEMORY

(71) Applicant: Intel Corporation, Santa Clara, CA (US)

(72) Inventors: Chia How Low, Simpang Ampat (MY); Roger Cheng, Campbell, CA (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 17/887,606

(22) Filed: Aug. 15, 2022

(65) Prior Publication Data

US 2024/0055042 A1     Feb. 15, 2024

(51) Int. Cl.
*G11C 7/22* (2006.01)
*G11C 11/4076* (2006.01)

(52) U.S. Cl.
CPC ................................ *G11C 11/4076* (2013.01)

(58) Field of Classification Search
CPC .................................................. G11C 11/4076
See application file for complete search history.

(56) References Cited

U.S. PATENT DOCUMENTS

| | | | | | |
|---|---|---|---|---|---|
| 5,978,929 | A | * | 11/1999 | Covino | .................... G11C 7/22 |
| | | | | | 713/600 |
| 2019/0065105 | A1 | * | 2/2019 | Gans | ......................... G11C 8/10 |
| 2020/0321039 | A1 | * | 10/2020 | Kim | ...................... G11C 11/413 |

* cited by examiner

*Primary Examiner* — Min Huang
(74) *Attorney, Agent, or Firm* — Schwegman Lundberg & Woessner, P.A.

(57) ABSTRACT

An apparatus, system, and method for improved memory control are provided. A circuit can include controller circuitry configured to determine, based on a speed of silicon of a memory, a read strobe code that adjusts a data clock to account for a difference between a reference clock and a data clock in terms of a number of unit intervals (UIs) and a read strobe code, a receive delay locked loop to receive the difference and delay the data clock by the number of UI and read strobe codes resulting in a delayed data clock, and a sampling amplifier to sample data from the memory based on the delayed data clock.

20 Claims, 11 Drawing Sheets

*1100*

STROBE DELAY CALIBRATION FOR UNMATCHED RECEIVE MEMORY

TECHNICAL FIELD

Embodiments pertain to calibrating a read strobe delay in a memory with an unmatched receive path.

BACKGROUND

A memory with an unmatched receive path offers improvements over a memory with a matched receive path. The improvements include improved signal integrity at higher bandwidth, among others. However, the unmatched receive path still has problems and improvements are desired.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Some memory devices, such as a double data rate (DDR) 5 (DDR5), DDR4, low power DDR (LPDDR) LPDDR4x), LPDDR5, or the like can use an unmatched receive path or a matched receive path. These architectures can use a decision feedback equalization (DFE)/strong arm latch (SAL) for sampling input or output data. The data sampled is commonly referred to as "DQ data" and is provided on "DQ pins". In a DDR architecture two DQ words are transferred per clock cycle, using both the positive and negative edges of the clock. With each word of data in input mode (reading from random access memory (RAM)), a data-strobe (sometimes called "RXDQS") is transferred for synchronization to control sampling time.

DFE (Decision Feedback Equalization)/SAL (strong arm latch) can be used for sampling the data at a DQ pad of a memory. The memory with unmatched receive (RX) path with the integration of DFE offers superior signal integrity performance at higher bandwidth. Read strobe (sometimes called "RXDQS") quality is important for ensuring data accuracy and integrity. Compensation for the RX strobe delay (sometimes called "TDQS2TDQ") helps ensure that the DQ data is sampled at the proper time.

Figure 1:
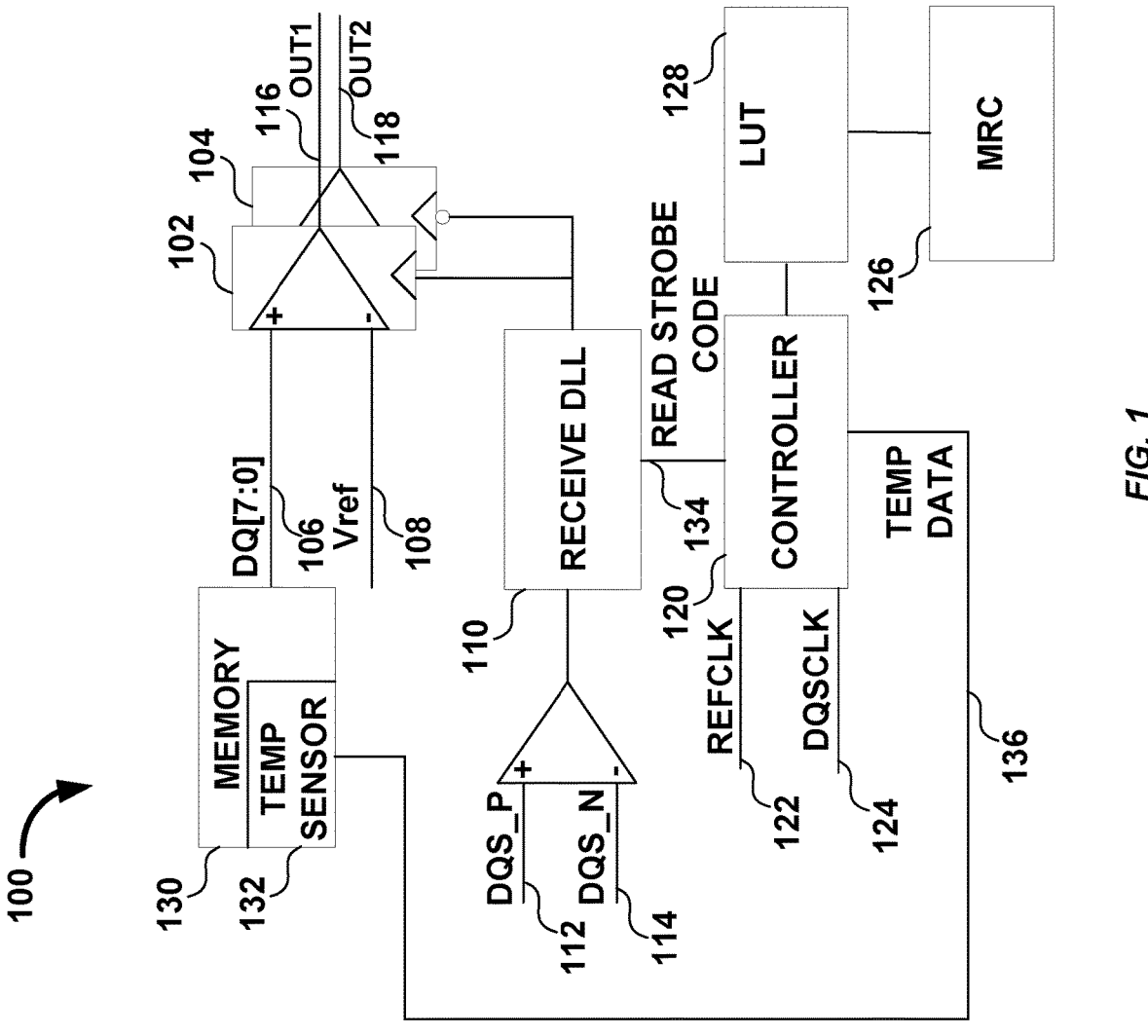
FIG. 1 illustrates, by way of example, a diagram of an embodiment of a memory circuit for a memory device with read strobe code adjustment.

FIG. 1 illustrates, by way of example, a diagram of an embodiment of a memory circuit 100 for a memory device with read strobe code adjustment. The circuit 100 as illustrated includes sampling amplifiers 102, 104 that operate to sample and provide a digital representation of input data 106 from a memory 130 based on a reference voltage 108. A delay locked loop (DLL) 110 (sometimes called a "secondary DLL" because it simply follows a delay from another DLL) delays a clock signal DQS_P 112, DQS_N 114 for an amount of time for the sampling amplifiers 102, 104. The clock signal is delayed with a goal of matching an edge of the delayed clock signal with an edge of a REFCLK 122. The edge of the delayed clock signal provided by the receive DLL 110 is intended to be centered between rising and falling edges of the data 106. This centering of the clock signal helps ensure that the data 106 is sampled accurately by the sampling amplifiers 102, 104. Each of the sampling amplifiers 102, 104 produces a respective output 116, 118 that is intended to be separate bits of the input data 106. Since the sampling amplifier 104 is driven by the falling edge of the clock from the receive DLL 110, two data bits are determined per clock cycle.

Currently, the read strobe delay (an amount the DQSCLK 124 is delayed) is calibrated at uniformly distributed periods. Calibration is performed by a finite state machine (FSM) that adjusts the amount the receive DLL 110 delays the clock signals. The FSM calibration (sometimes called "RXDQSCOMP") can run during any of the link traffic types (e.g., read, write, or idle) at a given periodic interval. However, the calibrated results will only affect the read transaction. The amount of the read strobe delay is sensitive to the Vcciog supply. The current read strobe calibration schemes have found significant variations at periodic calibration intervals. This variation can be due, at least in part, to the delta on the Vcciog noise and IR (voltage drop due to current flow through a resistor) drop level across different traffic types. For example, there is about a 40 millivolt (mV) delta on the Vcciog between a read state and an idle state. This voltage difference translates to about 25 picosecond (pS) read margin loss at 6400 mega transfers per second (MT/s). This receive margin loss is not able to recover thru training during boot time. After training, the periodic calibration keeps running and is updated during an idle state while the calibrated code is being used for the next read burst. But the read, as previously discussed, has a different Vcciog IR drop and noise level. The situation becomes even worse when considering temperature drift because the memory should operate reliably between 10° C. to 90° C. and temperature affects the delay along with the operation state.

A same read strobe calibration algorithm is currently used for both DDR5 and LPDDR5 technology. For calibration occurring in different operational states, there can be about a 10 code or about 25 pS variation in calibration. The temperature drift can introduce about another 4-code offset on top of the run-to-run variations. This provides a total of about a 14-code variation that is directly translated into a receive margin loss and can cause a failure on the memory. To overcome this issue, some memories have changed the DDR5 to have a matched receive path to support maximum bandwidth at 4800 MT/s. However, some memories still use an unmatched receive path with DFE for 6400 MT/s or higher operation. Another solution to matched receive path margin loss is to disable the periodic calibration and offset the read strobe code periodically based on thermal sensor information and high-volume manufacturing (HVM) data store in fuse bits for cold and hot temperature. A linear interpolation can then be used between the read strobe codes at hot and cold temperatures to determine the code used to adjust the strobe delay.

Some memories still use the matched receive path to support maximum bandwidth at 4800 MT/s. Some applications, however, require or desire a higher MT/s provided by the unmatched received path. One solution of handling the code variation of the unmatched receive path includes disabling a periodic calibration and reading a thermal sensor temperature periodically and program the offset code consistent with the thermal sensor temperature. The offset value is based on the linear interpolation concept where the slope is characterized at cold/hot temperature for each memory. A test can be used to readout the calibration code at cold/hot temperature and store the calibration code into fuse bits. The fuse bits are accessed and the slope is characterized for linear interpolation. The testing on each memory can be superfluous, however, and embodiments provide a more general solution to handling the unmatched receive path read strobe code issues.

Embodiments can use controller circuitry 120 that determines a read strobe code 134 to be applied to the DQS_P 112 and DQS_N 114 clock signals. The controller (FSM and replica circuitry) 120 can access a LUT 128 to determine the read strobe code 134. The LUT 128 can indicate sufficient information for the controller circuitry 120 to determine the read strobe code 134 based on temperature data 136 from a temperature sensor 132 that indicates a temperature of the memory 130 (or SOC die temperature). The LUT 128 can further indicate sufficient information for the controller circuitry 120 to determine the read strobe code 134 based on a type of silicon of the memory 130. The type of silicon can be based on the speed of the silicon (e.g., fast, typical, slow, fast-typical, typical-slow, or the like). The speed of the silicon can be quantified by determining a number of complete unit intervals (UIs) used move the DQSCLK 124 to match the REFCLK 122. More details regarding UIs are provided regarding FIG. 4 and elsewhere.

The controller circuitry 120 can include electric or electronic components configured to perform operations for controlling the read strobe code 134. The controller circuitry 120 can be implemented as a finite state machine (FSM) that provides an output given an input. The electric or electronic components can include one more resistors, transistors, capacitors, diodes, inductors, memory devices, processing circuits (e.g., a central processing unit (CPU), graphics processing unit (GPU), field programmable gate array (FPGA), application specific integrated circuit (ASIC), or the like), logic gates (e.g., AND, OR, XOR, negate, buffer, or the like), power supplies, amplifiers, multiplexers, switches, or the like.

An MRC 126 can operate during boot time to initialize entries of the LUT 128. The MRC 126 can determine the number of UIs and a corresponding slope between endpoints of a primary slope line (a line indicating the read strobe code versus temperature in read mode for the memory 130) and a secondary slope line (a line indicating the read strobe code versus temperature in idle mode for the memory 130) of the memory 130.

The memory 130 can include a DDR5 memory or the like. The temperature sensor 132 is a transducer that converts a temperature about the memory 130 to an electric signal indicating the temperature.

Figure 2:
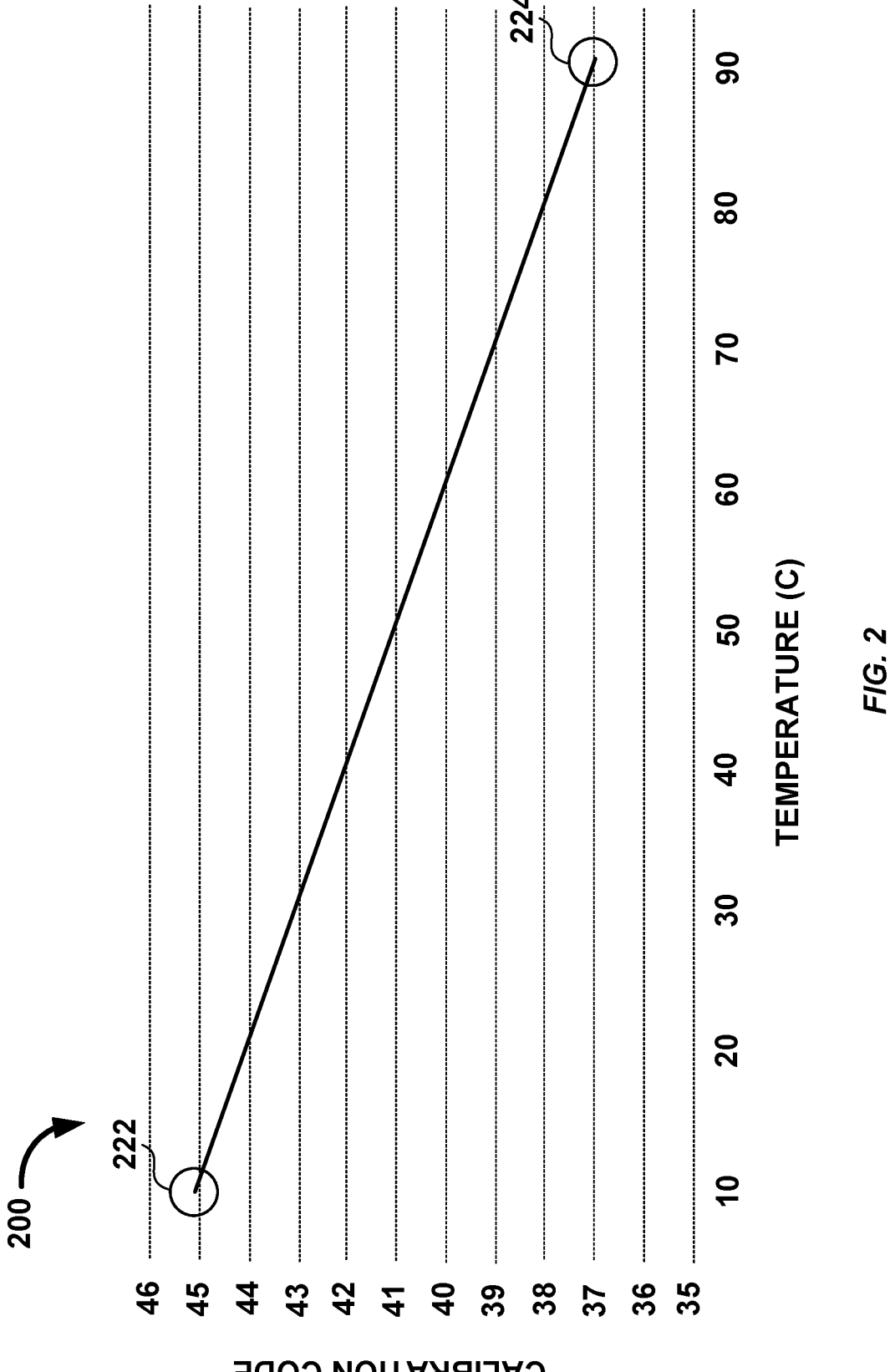
FIG. 2 illustrates, by way of example, a graph of calibration code versus temperature for an example memory.

FIG. 2 illustrates, by way of example, a graph 200 of calibration code versus temperature for an example memory. To generate the graph 200, the calibration codes for two extreme temperatures are determined. In the example of FIG. 2, the temperatures are 10 and 90 degrees C. and are represented by circles 222, 224. The codes at these temperatures are then used to determine a slope for a line that includes both points. The slope can be determined as (difference in code at extreme temperatures)/(difference in extreme temperatures). In the example of FIG. 2 the slope is $(45-37)$codes/$(10-90)$degrees C.$=-8/80$ codes/degrees C.$=-1/10$ codes/degrees C. Then, the controller circuitry 120 associated with the memory 130 looks up the temperature of the memory 130 from a thermal sensor 132 and sets the code according to the slope. This can be done using the LUT 128, a formula that represents the line, or the like. The formula in the example of FIG. 2 is: code$=-1/10$*temperature+46. A weakness of this simple linear interpolation approach is shown in FIG. 3.

When code calibration is run periodically and the temperature remains constant (e.g., 10 C or other temperature), the read margin variations from run-to-run are large when compared to the periodic compensation (sometimes called calibration) disable case. This is mainly due to the periodic calibrated code varying across different traffic types as described above. The run-to-run variations is able to reduce when the periodic code calibration is disabled, but this is not practical as the design will suffer temperature drift, which eventually periodic calibration can be used to fix.

Figure 3:
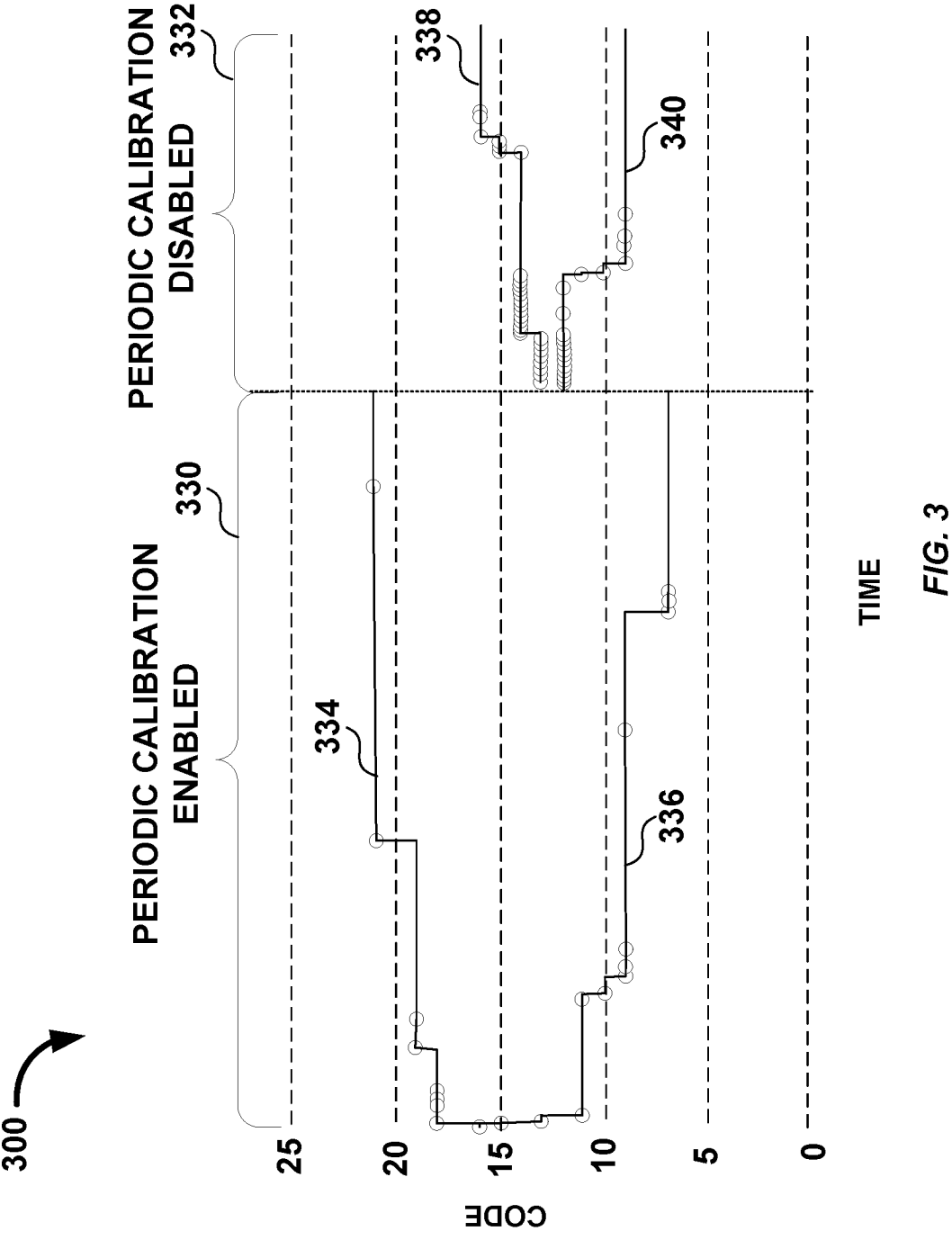
FIG. 3 illustrates, by way of example, a graph of code envelopes for when periodic calibration is enabled 330 and when periodic calibration is disabled 332 for a solution that does not use linear interpolation.

FIG. 3 illustrates, by way of example, a graph 300 of code envelopes for when periodic calibration is enabled 330 and when periodic calibration is disabled 332. The envelope in the example of FIG. 3 is the highest and lowest calibration code up to that time for a given mode (periodic calibration enabled or disabled). Each envelope is thus represented by two curves. For a periodic calibration enabled mode 330, a line 334 represents the maximum code used so far and a line 336 represents the minimum code used so far. The difference between the lines 334, 336 represents the margin loss. Circles represent when a code that meets or exceeds the present minimum or maximum is produced. Codes between circles are thus some value between the minimum and maximum code values realized up to that time. As can be seen in FIG. 3, the operation while the periodic calibration is disabled has a much smaller envelope (represented by lines 338 and 340), but temperature drift will eventually make the code produced when periodic calibration is disabled drift and the memory will return incorrect read data.

The solution that uses a thermal sensor readout can provide a more stable read margin (a smaller code envelope) as the read strobe code is programmed to one fixed code indexed by the thermal sensor data. However, this implementation has a dependency on the HVM side. Every single part is required to go thru HVM test to readout the read strobe compensation code at hot and cold temperature. Fuse bits are then used to store the HVM read strobe compensation code data at minimum and maximum temperatures. Common minimum and maximum temperatures are 10 C and 90 C but can be different temperatures. The controller circuitry 120 can access the fuse bits and download the HVM data for slope characterization. This solution has added complexity at the system on chip (SOC) full chip integration and HVM test. This solution thus includes HVM test to characterize the read strobe compensation code at cold and hot temperatures. Such testing reduces the HVM test flexibility and increases test time. At the same time, the linear interpolation is not perfect and may give some errors as the slope is created based on an HVM environment which is not guaranteed, and quite likely does not match, an actual operational environment of the memory 130. The HVM environment has a quiet Vcciog when only the read strobe calibration is running and the Vcciog noise/IR drop are totally different than the actual read data transaction after training. Also, the PHY does not go thru memory reference code (MRC) training in HVM environment, all settings for the PHY are default. The MRC is a fundamental component in the design of some computers. The MRC is the part of motherboard firmware that determines how the RAM will be initialized, and adjusts memory timing algorithms correctly for the effects of any modifications set by the user or computer hardware.

Embodiments will continue to access thermal sensor data but will apply an offset code 134 to a thermal sensor 132 result based on a LUT 128 built from pre-silicon power, voltage, and temperature (PVT) simulations. A mechanism to identify a silicon skew with respect to the read strobe code 134 results thru different Vcciog targets can be leveraged by embodiments. The simulation-based LUT 128 provides different interpolation slopes for the read strobe code 134 across fast (4 codes), typical (6 codes) and slow (10 codes) skew for a given range (e.g., 10 C-90 C) range. Embodiments can further include periodic slope correction, such as to improve the accuracy over a memory lifetime.

With prior solutions, a test can readout the read strobe code at an extreme hot and an extreme cold temperature for every single silicon part. This situation may impact the PHY design requirement and limit the sort/class test strategy. Embodiments can completely remove the PHY dependency on HVM and fuse bits requirements. Embodiments help to save HVM cost and test times. Some steps can be done with the MRC 126 to configure the PHY operating in actual read mode and mimic the actual Vcc conditions. Embodiments allow for a module in a package (MIP) PHY to use an unmatched receive path with DFE that achieves LPDDR5≥6400 MT/s and DDR5≥5600 MT/s.

The read strobe code 134 calibration scheme of embodiments basically compares a delay between a reference clock (REFCLK) 122 path and a replica RXDQS clock 124 path (forwarded CLK). The controller circuitry 120 will push (e.g., delay) the REFCLK 122 path by a unit interval (UI) as a coarse calibration step. For each UI, the controller circuitry 120 will further sweep the read strobe code through all of its values (e.g., 64 steps for current technology) to search for a finer calibration value in the forwarded CLK 124 path. The read strobe clock path will converge, according to the controller circuitry 120, when the forwarded CLK 124 path is matched (includes a rising or falling edge that is concurrent) with the REFCLK 122 path. The periodic calibration run at different traffic types causes large read strobe code variations (see FIG. 3). The number of UI and the read strobe code is required to match the REFCLK 122 and the DQSCLK 124 paths is obtained thru the read strobe calibration of embodiments. The read strobe calibration will provide an initial number of UIs for the MRC training to select a best pre-amble length setting at DDR5/LPDDR5 unmatched receive path.

Figure 5:
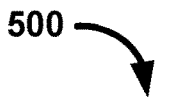
FIG. 5 illustrates, by way of example, a diagram of a method for read strobe code determination.
Figure 5:
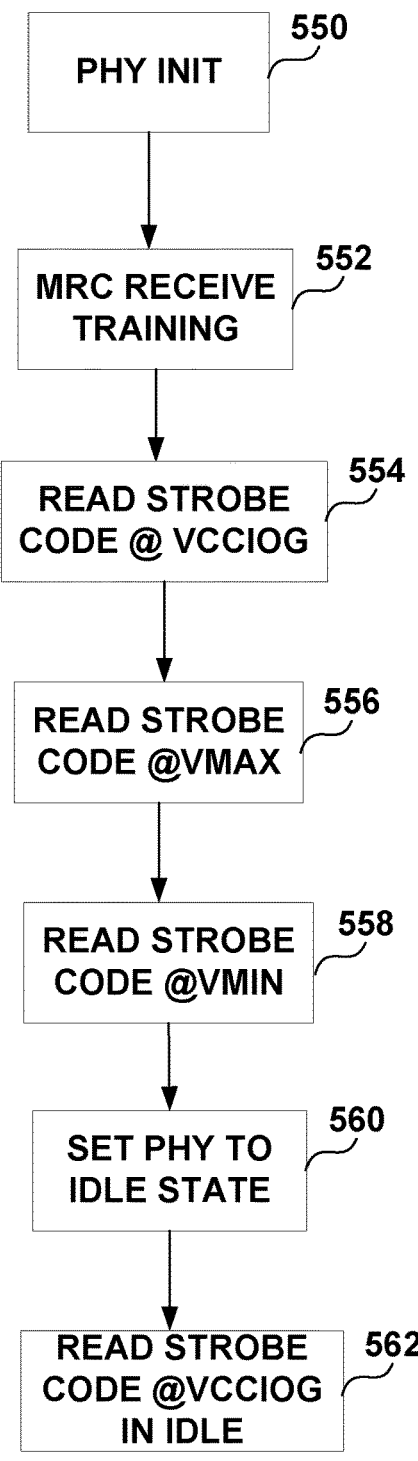

Embodiments create a solution within MIP PHY and remove all the HVM and SOC fuse bit dependencies. From the PVT simulations data, the number of UI can be categorized based on the type of silicon (e.g., fast/typical/slow) as shown in FIG. 5. The larger the number of UI means a longer minimum delay within the DQSCLK 124 path. Subsequently, the delay can be further specified by binning the skew into a more precise class by adjusting the Vcciog. Note, in some examples, the Vcciog dominates the DQSCLK 124 delay. The Vcciog is generated by an internal LVR design where the final voltage target can be adjusted thru the reference voltage (Vref).

Figure 4:
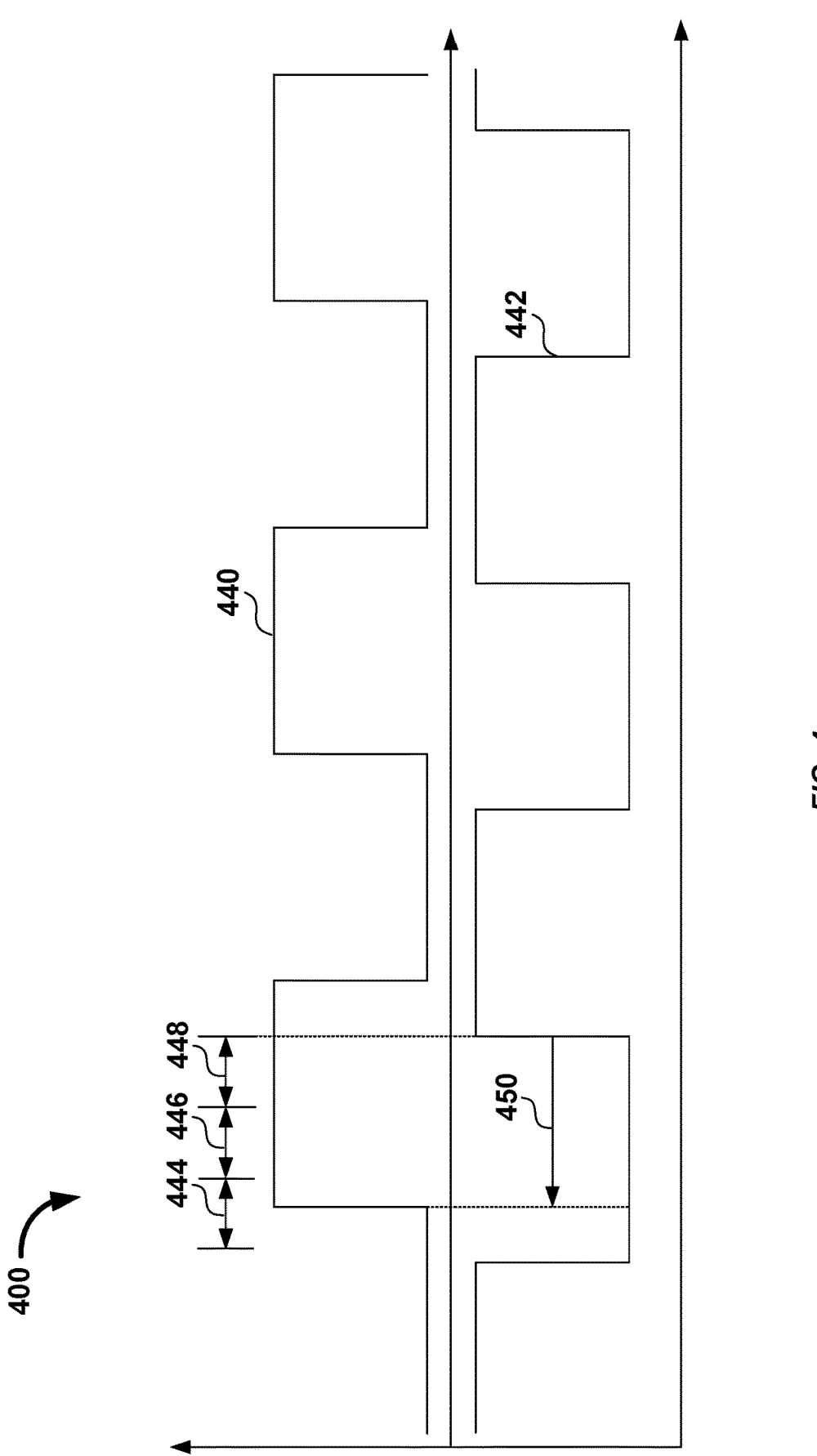
FIG. 4 illustrates, by way of example, a graph of voltage versus time for a reference clock and a DQS clock.

FIG. 4 illustrates, by way of example, a graph 400 of voltage versus time for a reference clock (represented by line 440) and a DQS clock (represented by line 442). The goal of calibration is to line up the rising edges of the reference clocks and the DQS clock as close as possible as indicated by arrow 450. In doing this, there is a finite amount of delay that can be applied by the receive DLL with fine adjustment. A maximum extent of the fine adjustment is called a unit interval (UI). Arrows 444, 446, 448 represent respective UIs. The number of UIs (represented by 446, 448) that the DQS clock can be delayed without passing the rising edge of the reference clock is a coarse adjustment. The read strobe code 134 is the fine adjustment that delays the DQS clock less than the amount possible using a UI.

FIG. 5 illustrates, by way of example, a diagram of a method 500 for read strobe code determination. The method 500 as illustrated includes initializing the memory PHY (a memory subsystem that interfaces with external memory devices (e.g., DRAM), at operation 550; performing MRC receive training, at operation 552; determining a read strobe code at Vcciog, at operation 554; determining the read strobe code at Vmax, at operation 556; determining the read strobe code at Vmin, at operation 558; setting the PHY to idle state, at operation 560; and determining a read strobe code at Vcciog in idle mode, at operation 562.

The operation 550 can include a sequence of programming and compensation flow to get the design ready to be functional and operate at an optimum setting before MRC training starts.

The operation 552 can operate on bootup of a computer. The MRC performs a firmware calibration of a memory device and is part of basic input/output system (BIOS). The MRC includes information about memory settings, frequency, timing, driving and detailed operations of the memory controller. The MRC is written in a code, which can be edited and compiled to provide an ability to tune memory operation. The operation 552 provides a baseline read strobe code and temperature and slope used for linear interpolation.

The operation 554 can include determining an average read strobe code at Vcciog for a specified number of read strobe code readouts. The operation 554 can further include recording a temperature of the memory from a thermal sensor.

The operation 556 can include decreasing the read path delay by increasing the voltage (Vcciog) to a maximum value. The maximum value is the highest voltage at which the memory is known or expected to operate properly. The operation 556 can include determining an average rad strobe code at Vmax for a specified number of read strobe code readouts. The specified number can be the same or different than the number of readouts at operation 554.

The operation 558 can include increasing the read path delay by decreasing the voltage (Vcciog) to a minimum value. The minimum value is the lowest voltage at which the memory is known or expected to operate properly. The operation 558 can include determining an average read strobe code at Vmin for a specified number of read strobe code readouts. The specified number can be the same or different than the number of readouts at operations 554, 556.

The operation 562 can include determining an average read strobe code at Vcciog for a specified number of read strobe code readouts while the memory is in idle. The specified number can be the same or different than the number of readouts at operations 554, 556, 558.

The method 500, at operation 552 uses an MRC algorithm to perform an advanced read training and ensure the data pattern is closer to an actual memory read transaction. This is in contrast to prior techniques that use HVM testing to determine the read strobe codes and slopes. The MRC can determine a read strobe code and check the thermal sensor data to understand the current temperature. Since the read strobe code results will dither from run-to-run due, at least in part, to Vcciog noises, the MRC can repeat the instruction to get the read strobe code readout for X number of readout (e.g., 100 or more or fewer readouts). Each read strobe code readout cycles can be done within 7-8 microseconds (uS). The number of read strobe code readouts can be variable and decided based on an MRC latency specification (part of the BIOS). In most of the cases, the full MRC training latency is up to 30-60 seconds and adding a few milliseconds for this calibration will not be a concern. The initial read strobe code determination from the MRC will report out the number of UI and the read strobe code at the current temperature. The controller circuitry 120 can record the average results from the X calibration loops. Such an averaging helps reduce dithering errors in the read strobe code. The read strobe code and temperature are used as baseline for linear interpolation in an actual memory read transaction.

The operations 556 and 558 help identify a silicon skew. The silicon skew informs the slope, and ultimately a number of code changes, along a read strobe code curve. For different skews, different slopes, number of read strobe code changes, or a combination thereof, are used.

For a higher Vcc, there is a shorter RXDQS delay which is compensated using a larger read strobe code. For a lower Vcc, there is a longer RXDQS delay which is compensated using a smaller read strobe code. For a higher temperature higher temperature, there is a longer RXDQS delay which is compensated using a smaller read strobe code. Lower temperature, shorter RXDQS delay, larger SDLL code. RXDQS is referring to the strobe path delay. Example, when RXDQS has a longer delay the SDLL code (read strobe code) does not need to be compensated too much (means smaller read strobe code) to align with REFCLK. When the RXDQS delay is shorter, that means that the SDLL code is increased to push REFCLK back to the same total delay with the REFCLK target.

Figure 6:
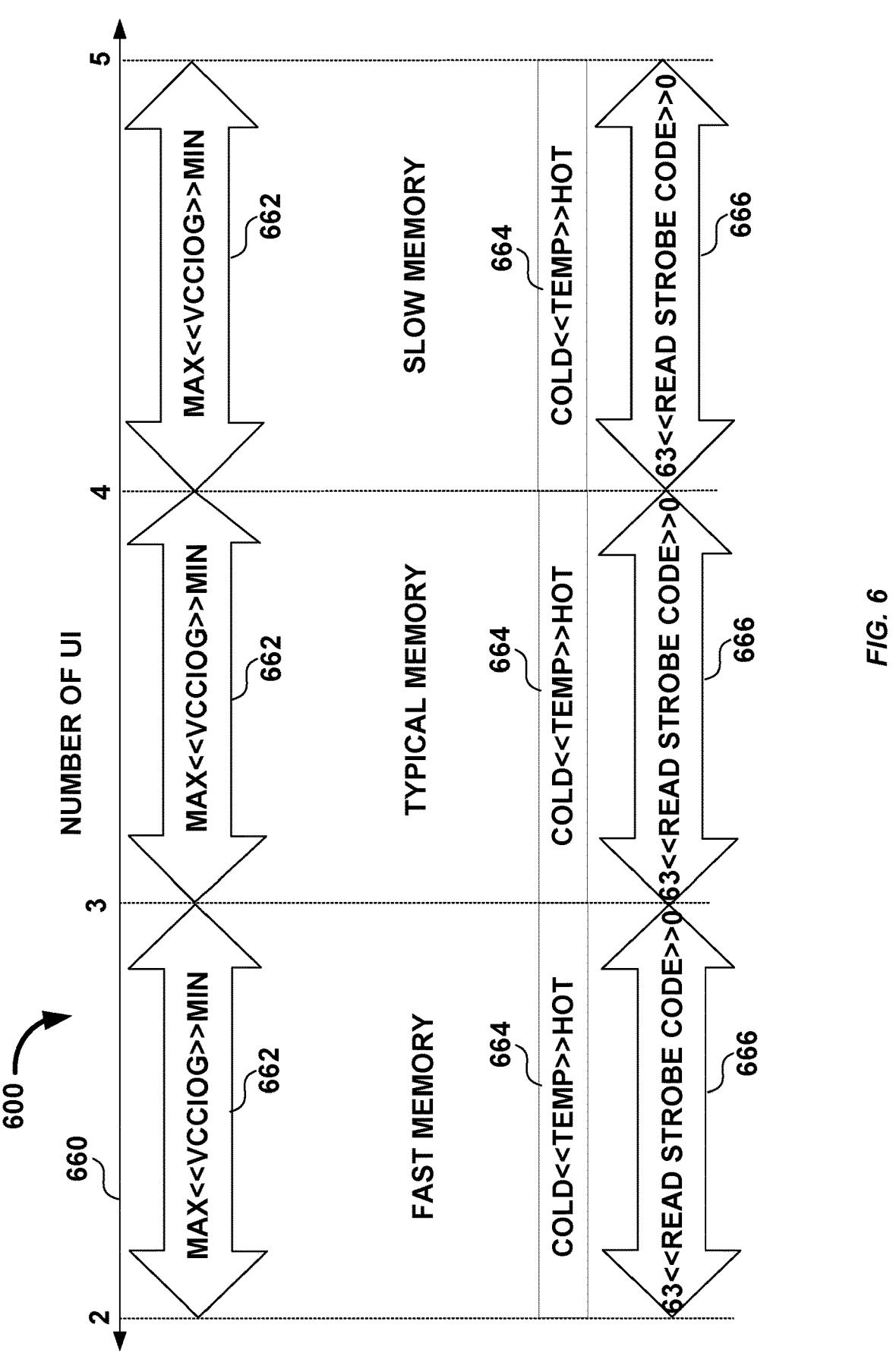
FIG. 6 illustrates, by way of example, a graph of an embodiment of a silicon skew characterization.

FIG. 6 illustrates, by way of example, a graph 600 of an embodiment of a silicon skew characterization. The graph 600 as illustrated includes UI (represented by line 660), voltage (represented by lines 662), read strobe code (represented by lines 666), and temperature (represented by lines 664). Each combination of [UI, voltage, and temperature] are mapped to a slope that defines a code step size per unit temperature change. Table 2 shows a

TABLE 1

| | LUT WITH SKEW MAPPING | | | | |
|---|---|---|---|---|---|
| | READ STROBE CODE BASED ON SKEW | | | | |
| | FAST | FAST-TYP | TYP | TYP-SLOW | SLOW |
| 10 C.-90 C. TEMPERATURE CODE RANGE | 4 | 5 | 6 | 7 | 8 |
| SLOPE (PER 10 DEGREES C.) | 0.5 | 0.625 | 0.75 | 0.875 | 1 |

The read strobe code 134 for Vcciog min/max values can be used as a first qualifier for skew mapping in the LUT 128. For example, assume the initial read strobe code 134 has a reported UI of 3 at Vnominal and temperature of 90 C. This memory would be trending fast/Vmin or typical/Vmax conditions if the temperature remain unchanged in a next run. Ideally, the temperature of the silicon near the MIP PHY coordinate will not change very much with the constant use case (read code strobe running only), but the temperature can change while the read code strobe continues to run. Thus, it can be beneficial to continue to readout the temperature from thermal sensor 132 for each read strobe code 134 readout while the controller circuitry 120 searches for the most accurate silicon skew. The designer can define the cold and hot temperature range based on their PVT simulation data. For example, 'cold temp'<50 C and 'hot temp'=>50 C or finer temperature steps. The temperature information can be used as second qualifier when the skew is at a boundary of 2 skews (e.g., fast-typ, typ-slow, etc.). Please take note that the designer can readout the temperature value as second qualifier usage but may not have a method to modify the silicon die temperature.

The operations 558, 556 can include the MRC 126 performing read strobe calibration iterations by adjusting the Vcciog Vref, thru configuration registers programming, to obtain Vmin and Vmax, respectively. The operations 556, 558 help to modulate the replica DQSCLK 124 delay and identify the delay range. The thermal sensor data 136 can continue to be recorded in each of the operations 552, 554, 556, 558. At each min and max Vcciog value, the MRC can cause the read strobe calibration to run an "X" number of times. After that, the operation 560 includes the MRC resetting all the settings back to a default setting, which is from operation 552. At operation 560, the MRC can cause the read strobe calibration to run "X" number of times in idle state (NOT read/write for entire PHY). The operation 560 can obtain another baseline code during PHY idle state. This info can be used for slope correction over a lifetime of the memory. There are some secondary effects on the memory over its lifetime. Such secondary effects include the DLL re-locking and creating some delay drift and the receive circuit may degrade over the memory lifetime. The slope correction can be based on the new periodic read strobe calibration code run at operation 562 at time X and compare with the idle state read strobe calibration code results obtained during initial boot from the operation 562.

An example is now provided to help explain details of embodiments. Assume an initial read strobe calibration performed by the MRC has reported a UI of 3 and the read strobe calibration code=32 (which is 0.5 UI in this example) at 10 C after averaging from X number of read strobe calibrations (at operation 554). The below results summarize operations 554, 556, 558, 562. At Vcciog and UI 3, the read strobe code is 32. Referring to FIG. 6, this results in silicon that trends to typical. Then, at operation 556, the Vref is changed to Vmax and the read strobe calibration is performed again. This time, the UI is 3 again and the read strobe code is less than 32 and greater than 0. This reinforces that the silicon is trending to typical. Then, at operation 558, Vref is set to Vmin and the read strobe calibration is performed again.

Consider two different scenarios for the operation 558, one scenario in which the number of UI remain the same and another in which the number of UI increases with the change to Vmin. If the 3$^{rd}$ step is trending to retain the number of UI that were determined at operations 552, 554, 556 then the silicon is confirmed in typical skew. However, if the operations 558 trends to increase the number of UI that were determined at operations 552, 554, 556, this is showing the silicon can be about 1-2 sigma (standard deviations) slow. In this case, the temperature can be used as a qualifier to further narrow down the skew. Note: Higher temperature will have longer delay and resulting smaller read strobe code. If the operation 558 is performed at greater than 50 C (e.g., a midpoint between or an average of a highest temperature and lowest temperature at which the memory is expected to operate properly), the silicon is still trending to typical skew. If the operation 558 indicates the memory is running at less than 50 C (e.g., a midpoint between or an average of a highest temperature and lowest temperature at which the memory is expected to operate properly), then it is confirmed that the silicon is 1-2 sigma slow. At this condition, the controller circuitry 120 logic can map the memory to a typical-slow type and use a corresponding typical-slow LUT (see Table 1) to determine a calibration code for the memory.

The skew mapping to the UI number is based on the design and process technology. A periodic read strobe calibration feature that can be sensitive to the Vcciog noise can be disabled after the operation 562 is performed. A method 700 (see FIG. 7) picks up after the MRC is done performing initial calibration using the method 500.

Figure 7:
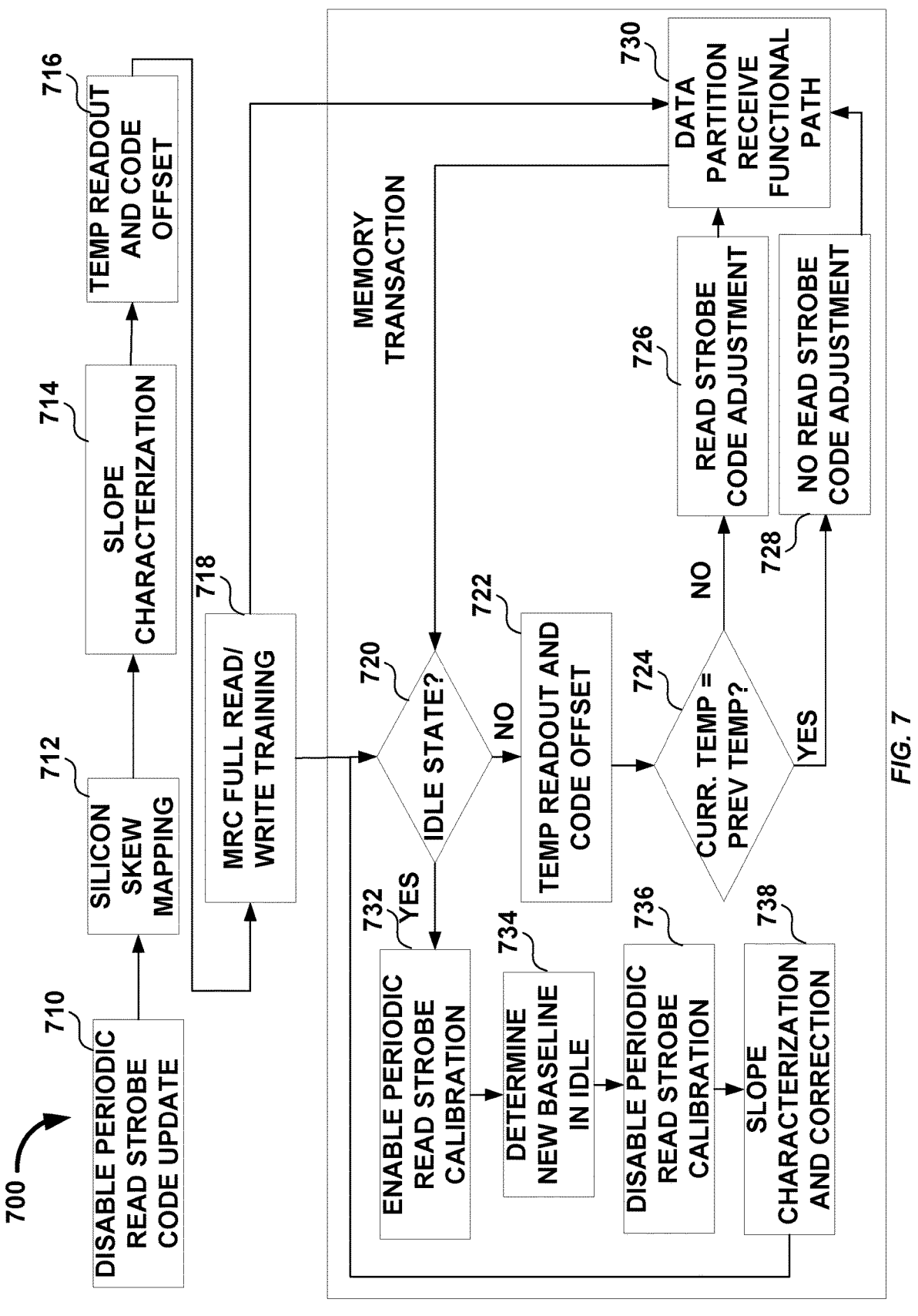
FIG. 7 illustrates, by way of example, a diagram of an embodiment of a method for skew mapping and correction after calibration and during runtime.

FIG. 7 illustrates, by way of example, a diagram of an embodiment of a method 700 for skew mapping and correction after calibration and during runtime. At operation 710, periodic read strobe code updating is disabled. At operation 712, the hardware controller circuitry 120 logic shall start performing a skew mapping. At operation 714, the skew mapping is mapped, via a LUT, to a slope characterization (primary slope) based on the operation 552 baseline read strobe calibration and initial temperature. The designer can define more PVT conditions in the LUT than those provided in Table 1, such as to provide higher accuracy of the mapping results but may need to tradeoff with the hardware logic design complexity. Using the LUT 128, the controller circuitry 120 can determine, at operation 716, the read strobe code 134. The operation 716 can include using one of the following formulas:

$$RXDQSCOMP@10\ C=Init\ RXDQSCOMP+(Tinit-T10/10)*step\ size$$

$$RXDQSCOMP@90\ C=Init\ RXDQSCOMP+(T90-TInit/10)*step\ size$$

Init RXDQSCOMP and Tinit are the average readout value after operation 710. T90=90 C, T10=10 C, and step size is at the Table 1 last row.

By referring to a slow skew as an example, the slope of the 10 C-90 C temperature range would have 8 read strobe code with about one code per 10 C. The above formula can be used to derive the linear curve after obtaining the read strobe code at 10 C and 90 C. Initial read strobe code and Tina are the average readout read strobe code and temperature values after operations 552 and 562, respectively. Step size is available in Table 1 LUT with the skew being identified after operation 558. A mathematical round up can be applied with an acceptable error hit (max 0.5 code error) at fast skew. Alternatively, a designer can choose to offset one code per every 20 C for fast skew case. The pre-silicon LUT may not have 100% accuracy and be correlated with post-silicon. The 10 C-90 C code range may benefit from programming in post-silicon. With skew selection, the designer can make use of the HVM small sample sizes (e.g., 500 units) to further validate the 10 C and 90 C code range and overwrite the step size value in Table 1 pre-silicon LUT.

At operation 718, the read strobe calibrated code from operation 552 will be further adjusted by the MRC algorithm to optimize the final centering of the read strobe code, such as to obtain maximum margin. Ideally, the operation 718 will ensure the read strobe code has enough margin to drift with voltage and temperature changes and continue having same UI value.

At operation 720, the controller circuitry 120 can determine whether the memory is in an idle state, as opposed to a read state or a write state. If the memory is not in an idle state, the controller circuitry 120 can determine a temperature and a corresponding code offset at operation 722. The code offset can be determined using the read strobe code equations above. At operation 724, the controller circuitry 120 can compare the current temperature to a previous temperature. If the current temperature is equal to the previous temperature the read strobe code adjustment can be zero and the most recent read strobe code can be used as the current read strobe code at operation 728. If the current temperature is not equal to the previous temperature, the controller circuitry 120 can perform a read strobe code adjustment using the read strobe code formulas above at operation 726. At operation 730, the receive path can operate to perform a read operation.

If the memory is in idle, the controller circuitry 120 can determine if a code offset is appropriate for the memory. At operation 732, periodic read strobe calibration can be enabled. This will cause read strobe calibration to be performed while the memory is in idle mode. At operation 734, a read strobe code at Vcciog can be determined to provide a new baseline code. At operation 736, the periodic calibration can be disabled to stop the calibration. At operation 738, the slope characterization and code offset can be corrected (if it makes sense). The slope characterization and code offset can be adjusted based on a difference between the read strobe code determined at operation 562 and the read strobe code determined at operation 738. While the change in read strobe code in idle may not be exactly the same as the read strobe code change in read mode, it does track very closely and provides a measure of the change in the memory while the memory is deployed and operating.

Figure 8:
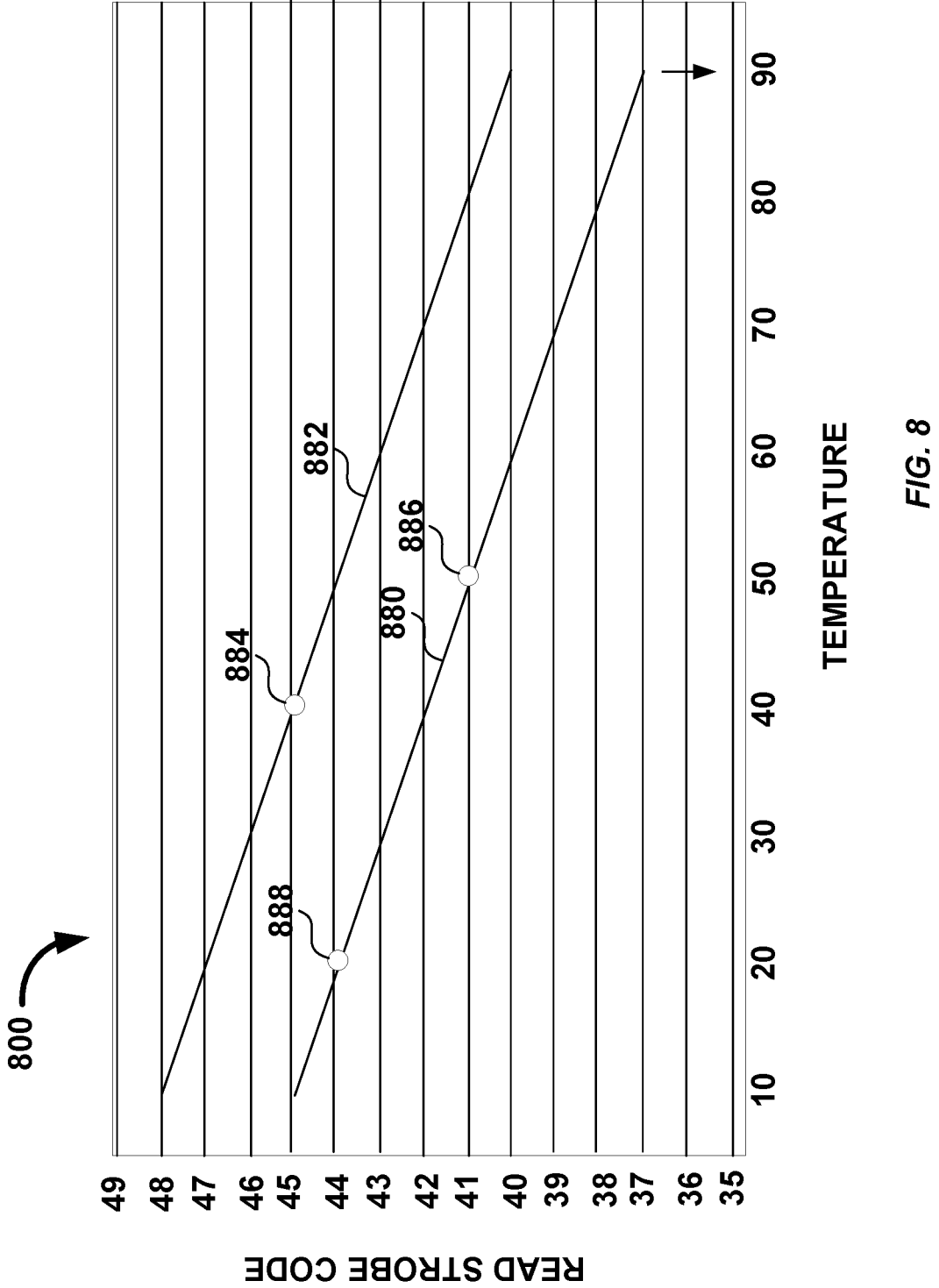
FIG. 8 illustrates, by way of example, a graph of read strobe code versus temperature for a memory made with slow skew silicon.

FIG. 8 illustrates, by way of example, a graph 800 of read strobe code versus temperature for a memory made with slow skew silicon. If the operation 552 is performed at 50 C with the read strobe code at 41 (represented by circle 886) with a UI greater than 4. The controller circuitry 120 will scale the curve linearly thru formula across 10 C (read strobe code 45)–90 C (read strobe code 37) with the targeted slope from the LUT in Table 1, for example. A higher temperature will have a longer delay and a resulting smaller read strobe code. A primary slope 880 for read operation linear inter-polation results from this. When the PHY is operating in a read transaction, the controller will periodically readout the current temperature from the thermal sensor output and the apply code offset based on the linear interpolation concept thru the primary slope 880. Similar to the operation 552, a secondary slope 882 can be obtained thru operation 562 (and using formulas presented above) across the temperature range of the memory. The secondary slope 882 can be used as baseline for slope correction over time. A circle 884 represents an initial temperature and read strobe code from operation 562. A circle 888 represents the read strobe code at run time after the temperature has decreased by 20 C.

Other than Vcciog effects, the entire read path may suffer some other secondary effects that can change a total mini-mum delay latency over a lifetime of the memory. One of the examples is that the DLL 110 can re-lock to another setting after entering/exiting from certain low power state, which may result in a few picosecond drift from the initial delay obtain from operations 552, 554, 556. The primary slope built during boot then may not always be optimal for using as a temperature-based read strobe code offset. Embodi-ments can thus enable the periodic read strobe calibration code determination and temperature sensor readout by con-troller circuitry 120 during idle state (link traffic not in Read/Write) (see operations 720, 732, 734, 736, 738 of FIG. 7).

Figure 9:
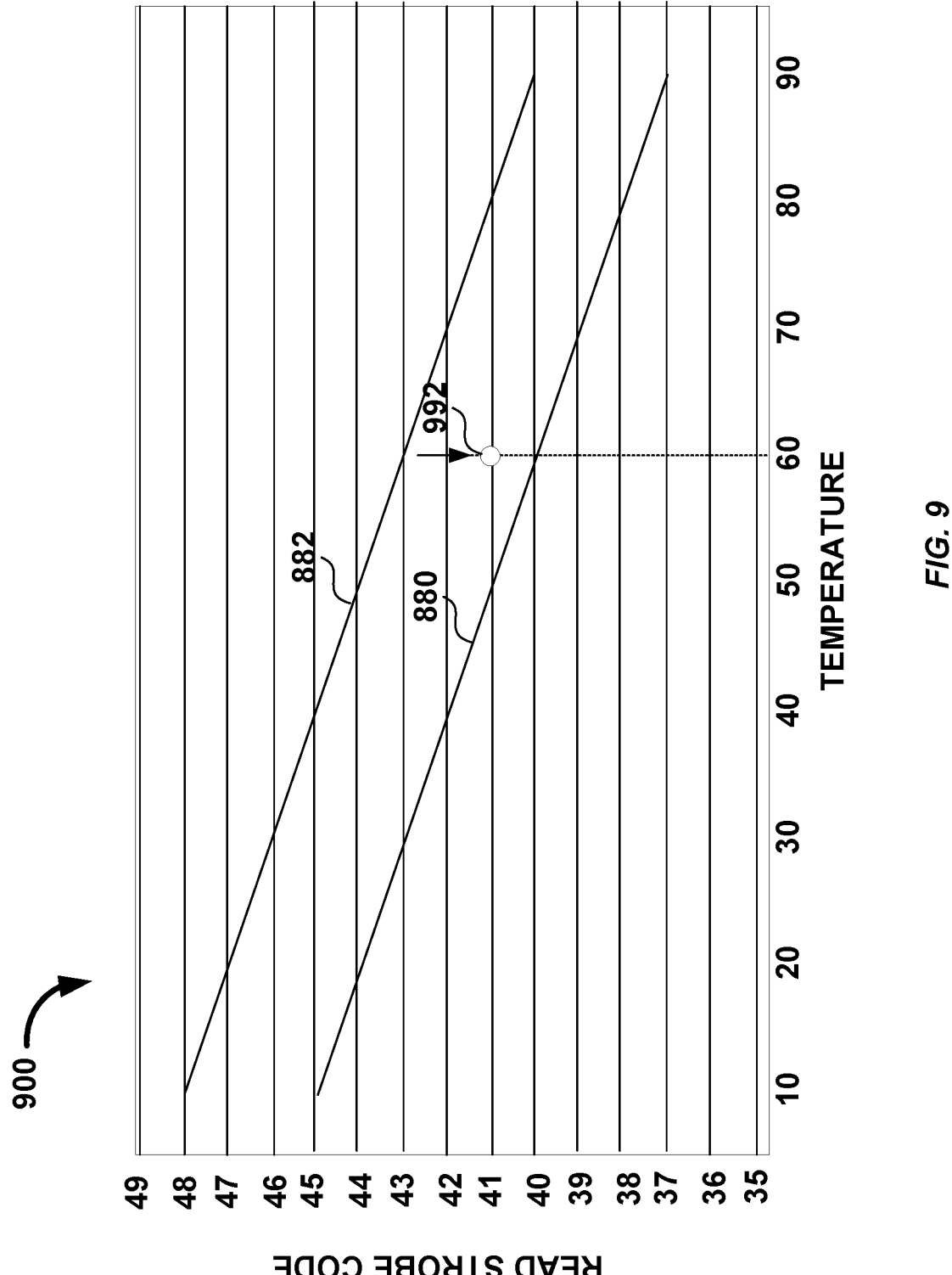
FIG. 9 illustrates, by way of example, a graph of an example of a shift in the read strobe code in idle mode after memory deployment.

FIG. 9 illustrates, by way of example, a graph 900 of an example of a shift in the read strobe code in idle mode after memory deployment. The graph 900 shows an initial read strobe code of 43 at 60 C as determined at operation 562. Then, during runtime and an idle mode the read strobe calibration is performed at 60 C and results in a read strobe code of 41. This point is not on the secondary slope 882. The secondary slope can be adjusted by moving the entire secondary slope down on the graph so that the secondary slope 882 passes through a point (represented by circle 992) representing the most recent read strobe code and tempera-ture. In the example of FIG. 9, each code is reduced by 2 to move the secondary slope 882 so that the point is on the secondary slope 882. The primary slope 880 can be reduced by a same amount as the secondary slope 882 to account for the change in the memory.

Figure 10:
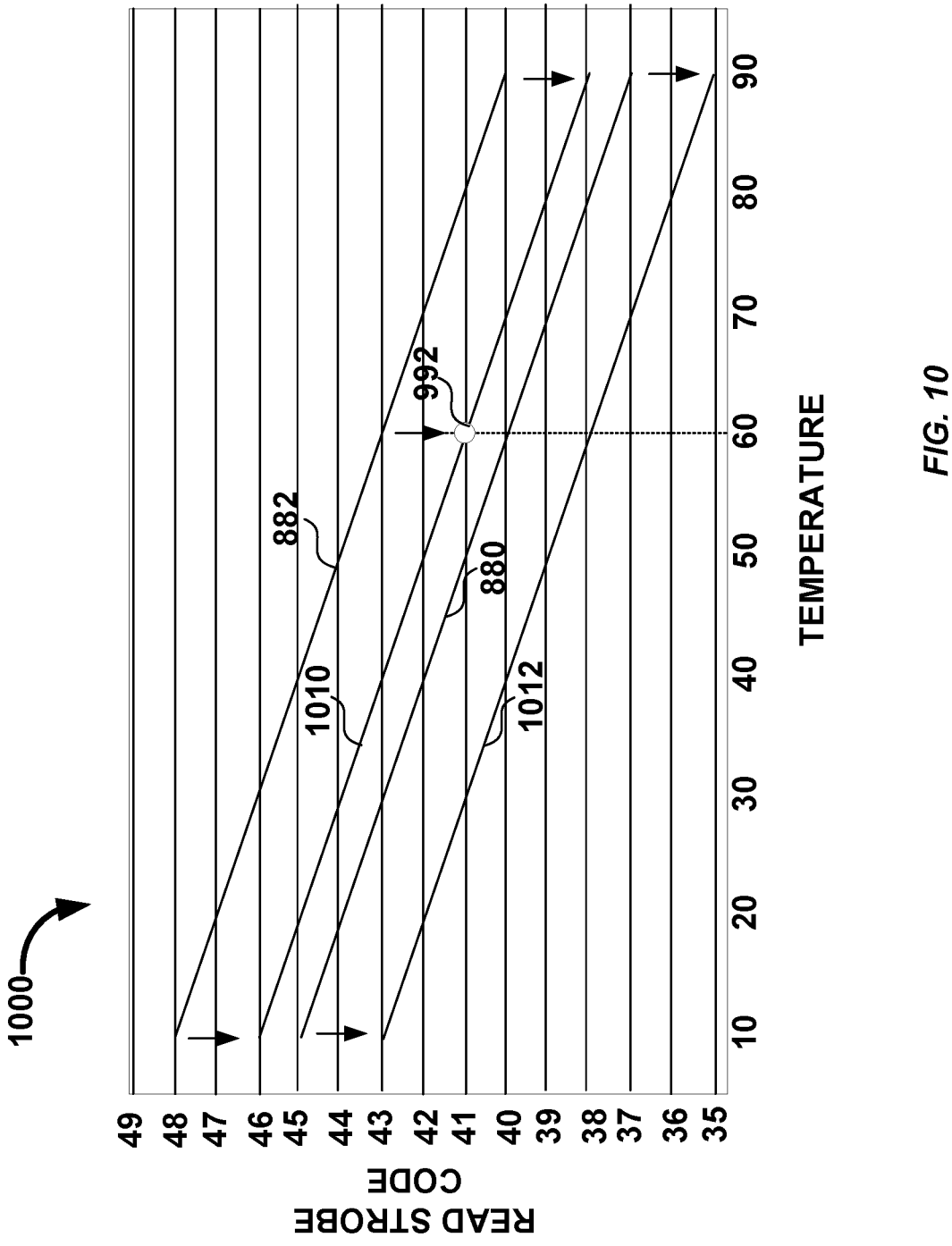
FIG. 10 illustrates, by way of example, a graph of primary and secondary slope corrections during runtime.

FIG. 10 illustrates, by way of example, a graph 1000 of primary and secondary slope corrections during runtime. The graph 1000 as illustrated includes the primary slope 880 (sometimes called an initial primary slope) and the second-ary slope 882 (sometimes called an initial secondary slope). The graph 1000 as illustrated further includes a corrected primary slope 1012 and a corrected secondary slope 1010. The corrected secondary slope 1010 is the secondary slope 882 adjusted so that it passes through the point represented by the circle 992. The corrected primary slope 1012 is the primary slope 880 adjusted by a same amount as the secondary slope 882 was adjusted to make it the corrected secondary slope 1010. In the example of FIG. 10, the read strobe code in idle mode from operation 562 has changed from 43 to 41 during runtime. With the initial slope, at temperature 60 C, the idle state read strobe code was 43. After a certain period of time, the idle state read strobe code has drifted to 41 at 60 C (temp sensor readout). The corrected secondary slope 1010 equals the initial secondary slope 882 minus a constant (2 in this case). The corrected primary slope 1012 equals the initial primary slope 880 minus the same constant. The correction can be performed at operation 1138.

Embodiments access the thermal sensor data but will remove the luxury of using fuse bits and HVM data collec-tion at cold and hot temperature requirements for each silicon. Embodiments can include the thermal sensor design in the memory, which will allow the FSM to directly access the thermal sensor readout. Further, embodiments can adjust the hot and cold temperature codes over time by performing a calibration during idle mode and comparing the codes to a previous calibration in idle mode. The code for the read transaction can then be adjusted by a same difference in coded determined for idle. This sort of configuration allows the code to be adjusted for degrading or otherwise changing silicon.

Embodiments need minor logic changes on top of current thermal sensor solutions. With embodiments, the precise periodic read strobe code offsets thru linear interpolation based on the temperature can be done without HVM support and Fuse bits requirements. All the design idea and steps described in this flowchart are done within the PHY, either thru hardware or software (MRC). The LUT skew mapping in operations 552, 554, 556 remove the HVM dependency. Unlike HVM solution that running with quiet Vcciog, the entire skew mapping and slope characterization are done with the PHY running in advanced read training mode. This allows the linear interpolation curve to be created based on actual read data pattern and Vcciog noises. The original periodic read strobe calibration that is sensitive to the Vcciog noise can be disabled and replaced with the periodic code offset method thru thermal sensor data. At every periodic temperature readout cycle, this idea only applies one fixed code only. This is huge improvement if compared to the original periodic FSM calibration that could having up to ~14 ticks variations from run-to-run to temperature drift. Re-enabling the periodic read strobe calibration in idle state to re-characterize the slope for better accuracy of linear interpolation over lifetime of the memory 130 is another advantage of embodiments.

Figure 11:
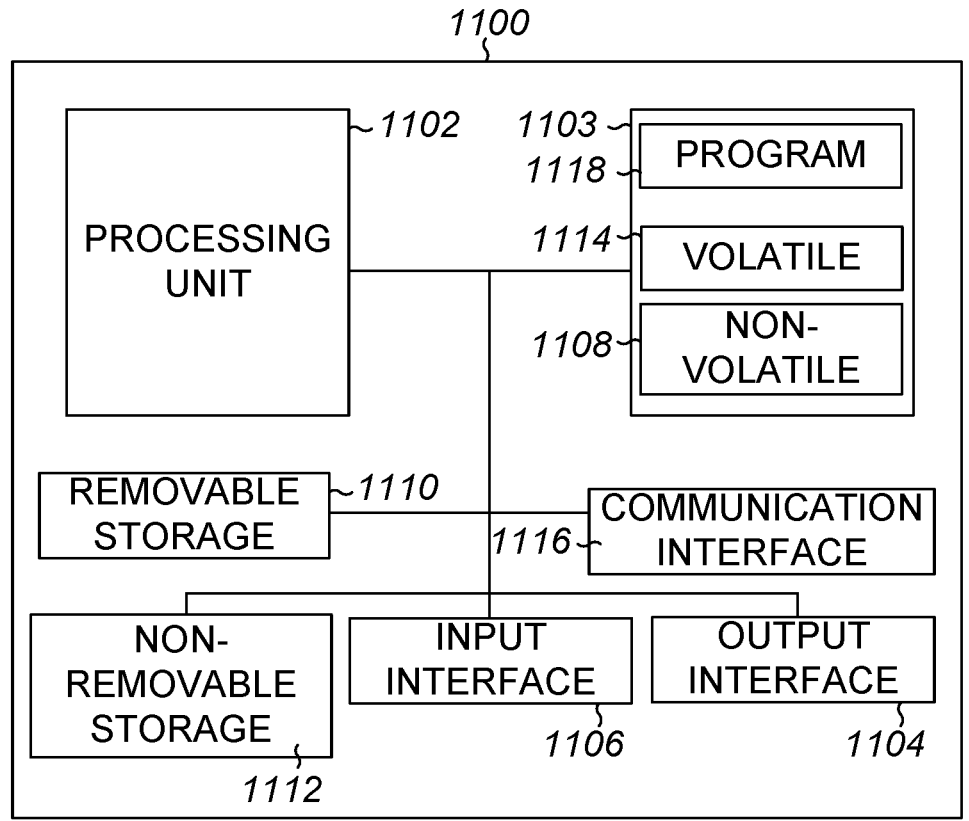
FIG. 11 illustrates, by way of example, a block diagram of an embodiment of a machine (e.g., a computer system) in which the read strobe code circuit or method of determining the read strobe code of FIGS. 1-10, a combination thereof or another circuit or method discussed herein can be used.

FIG. 11 illustrates, by way of example, a block diagram of an embodiment of a machine 1100 (e.g., a computer system) in which the read strobe code circuit or method of determining the read strobe code of FIGS. 1-10, a combi-nation thereof or another circuit or method discussed herein can be used. One example machine 1100 (in the form of a computer), may include a processing unit 1102, memory 1103, removable storage 1110, and non-removable storage 1112. Although the example computing device is illustrated and described as machine 1100, the computing device may be in different forms in different embodiments. Further, although the various data storage elements are illustrated as part of the machine 1100, the storage may also or alterna-tively include cloud-based storage accessible via a network, such as the Internet.

Memory 1103 may include volatile memory 1114 and non-volatile memory 1108. The machine 1100 may include—or have access to a computing environment that includes—a variety of computer-readable media, such as volatile memory 1114 and non-volatile memory 1108, removable storage 1110 and non-removable storage 1112. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1100 may include or have access to a computing environment that includes input 1106, output 1104, and a communication connection 1116. Output 1104 may include a display device, such as a touchscreen, that also may serve as an input device. The input 1106 may include one or more of a touchscreen, touchpad, mouse, keyboard, camera, one or more device-specific buttons, one or more sensors integrated within or coupled via wired or wireless data connections to the machine 1100, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1102 (sometimes called processing circuitry) of the machine 1100. A hard drive, CD-ROM, and RAM are some examples of articles including a non-transitory computer-readable medium such as a storage device. For example, a computer program 1118 may be used to cause processing unit 1102 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry", "processing circuitry", or "processor" as used herein thus refers to, is part of, or includes circuitry capable of sequentially and automatically carrying out a sequence of arithmetic or logical operations, or recording, storing, and/or transferring digital data. These terms may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Additional Notes and Examples

Example 1 includes a memory control circuit comprising controller circuitry configured to determine, based on a speed of silicon of a memory, a read strobe code that adjusts a data clock to account for a difference between a reference clock and a data clock in terms of a number of unit intervals (UIs) and a read strobe code, a receive delay locked loop to receive the difference and delay the data clock by the number of UI and read strobe codes resulting in a delayed data clock, and a sampling amplifier to sample data from the memory based on the delayed data clock.

In Example 2, Example 1 further includes a lookup table (LUT) that maps the number of UIs to the speed of silicon.

In Example 3, Example 2 further includes, wherein the LUT further maps the speed of the silicon to a step interval in the read strobe code per unit temperature.

In Example 4, at least one of Examples 2-3 further includes, wherein the controller circuitry is configured to adjust entries in the LUT during an idle mode operation of the memory.

In Example 5, Example 4 further includes a temperature sensor situated to provide temperature data indicating a temperature of the memory to the controller circuitry.

In Example 6, Example 5 further includes, wherein the controller circuitry is configured to determine, at boot up of the memory, an initial secondary slope line of the read strobe code versus temperature in idle mode.

In Example 7, Example 6 further includes, wherein the controller circuitry is configured to responsive to determining the memory is in idle mode, determine an updated read strobe code and an updated temperature of the memory, and responsive to determining the updated read strobe code at the updated temperature is not on the initial second slope, adjust the entries in the LUT.

In Example 8, Example 7 further includes, wherein the adjusting the entries in the LUT includes adjusting endpoints of the initial secondary slope line resulting in a corrected secondary slope line.

In Example 9, Example 8 further includes, wherein the corrected secondary slope line goes through the updated read strobe code at the temperature.

In Example 10, at least one of Examples 8-9 further includes, wherein the adjusting the entries in the LUT further includes adjusting endpoints of an initial primary slope line of the read strobe code versus temperature in read mode by a same amount as the endpoints of the initial secondary slope line.

Example 11 includes a device comprising a memory, controller circuitry configured to determine, based on a speed of silicon of the memory, a read strobe code that adjusts a data clock to account for a difference between a reference clock and a data clock in terms of a number of unit intervals (UIs) and a read strobe code, a receive delay locked loop situated to receive the difference and delay the data clock by the number of UI and read strobe codes resulting in a delayed data clock, and a sampling amplifier to sample data from the memory based on the delayed data clock.

In Example 12, Example 11 further includes a lookup table (LUT) that maps the number of UIs to the speed of silicon.

In Example 13, Example 12 further includes, wherein the LUT further maps the speed of the silicon to a step interval in the read strobe code per unit temperature.

In Example 14, at least one of Examples 12-13 further includes, wherein the controller circuitry is configured to adjust entries in the LUT during an idle mode operation of the memory.

In Example 15, Example 14 further includes a temperature sensor situated to provide temperature data indicating a temperature of the memory to the controller circuitry.

In Example 16, Example 15 further includes, wherein the controller circuitry is configured to determine, at boot up of the memory, an initial secondary slope line of the read strobe code versus temperature in idle mode.

Example 17 includes a method for memory control, the method comprising determining, by controller circuitry, based on a speed of silicon of a memory, a read strobe code that adjusts a data clock to account for a difference between a reference clock and a data clock in terms of a number of unit intervals (UIs) and a read strobe code, receiving, by a receive delay locked loop, the difference, delaying, by the receive delay locked loop, the data clock by the number of UI and read strobe codes resulting in a delayed data clock, and sampling, by a sampling amplifier, to data from the memory based on the delayed data clock.

In Example 18, Example 17 further includes responsive to determining the memory is in idle mode, determining, by the controller circuitry, an updated read strobe code and an updated temperature of the memory, and responsive to determining the updated read strobe code at the updated temperature is not on the initial second slope, adjust the entries in the LUT.

In Example 19, at least one of Examples 17-18 further includes, wherein the adjusting the entries in the LUT includes adjusting endpoints of the initial secondary slope line resulting in a corrected secondary slope line.

In Example 20, at least one of Examples 18-19 further includes, wherein the corrected secondary slope line goes through the updated read strobe code at the temperature.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory control circuit comprising:
controller circuitry configured to determine, based on a speed of silicon of a memory, a read strobe code and a number of unit intervals (UIs), a combination of which indicates an adjustment to a data clock to account for a difference between a reference clock and a data clock in terms of the number of UIs and the read strobe code, a single UI of the UIs is a maximum extent of a fine delay adjustment provided by a receive delay locked loop and the number of UIs constitutes a coarse adjustment to the data clock, the read strobe code is the fine delay adjustment to the data clock having multiple steps and delays the data clock by less than the single UI;
a receive delay locked loop to receive the difference and delay the data clock by the number of UIs and read strobe code resulting in a delayed data clock that is calibrated to line up an edge of the delayed data clock with an edge of the reference clock; and
a sampling amplifier to sample data from the memory based on the delayed data clock.

2. The memory control circuit of claim 1, further comprising a lookup table (LUT) that maps the number of UIs to the speed of silicon.

3. The memory control circuit of claim 2, wherein the LUT further maps the speed of the silicon to a step interval in the read strobe code per unit temperature.

4. The memory control circuit of claim 2, wherein the controller circuitry is configured to adjust entries in the LUT during an idle mode operation of the memory.

5. The memory control circuit of claim 4, further comprising a temperature sensor situated to provide temperature data indicating a temperature of the memory to the controller circuitry.

6. The memory control circuit of claim 5, wherein the controller circuitry is configured to determine, at boot up of the memory, an initial secondary slope line of the read strobe code versus temperature in idle mode.

7. The memory control circuit of claim 6, wherein the controller circuitry is configured to:

responsive to determining the memory is in idle mode, determine an updated read strobe code and an updated temperature of the memory; and responsive to determining the updated read strobe code at the updated temperature is not on the initial secondary slope, adjust the entries in the LUT.

8. The memory control circuit of claim 7, wherein the adjusting the entries in the LUT includes adjusting endpoints of the initial secondary slope line resulting in a corrected secondary slope line.

9. The memory control circuit of claim 8, wherein the corrected secondary slope line goes through the updated read strobe code at the temperature.

10. The memory control circuit of claim 8, wherein the adjusting the entries in the LUT further includes adjusting endpoints of an initial primary slope line of the read strobe code versus temperature in read mode by a same amount as the endpoints of the initial secondary slope line.

11. A device comprising:

a memory;

controller circuitry configured to determine, based on a speed of silicon of the memory, a read strobe code and a number of unit intervals (UIs), a combination of which indicates an adjustment to a data clock to account for a difference between a reference clock and a data clock in terms of the number of UIs and the read strobe code, a single UI of the UIs is a maximum extent of a fine delay adjustment provided by a receive delay locked loop and the number of UIs constitutes a coarse adjustment to the data clock, the read strobe code is the fine delay adjustment to the data clock having multiple steps and delays the data clock by less than the single UI;

a receive delay locked loop situated to receive the difference and delay the data clock by the number of UIs and the read strobe code resulting in a delayed data clock that is calibrated to line up an edge of the delayed data clock with an edge of the reference clock; and a sampling amplifier to sample data from the memory based on the delayed data clock.

12. The device of claim 11, further comprising a lookup table (LUT) that maps the number of UIs to the speed of silicon.

13. The device of claim 12, wherein the LUT further maps the speed of the silicon to a step interval in the read strobe code per unit temperature.

14. The device of claim 12, wherein the controller circuitry is configured to adjust entries in the LUT during an idle mode operation of the memory.

15. The device of claim 14, further comprising a temperature sensor situated to provide temperature data indicating a temperature of the memory to the controller circuitry.

16. The device of claim 15, wherein the controller circuitry is configured to determine, at boot up of the memory, an initial secondary slope line of the read strobe code versus temperature in idle mode.

17. A method for memory control, the method comprising:

determining, by controller circuitry, based on a speed of silicon of a memory, a read strobe code and a number of unit intervals (UIs), a combination of which indicates an adjustment to a data clock to account for a difference between a reference clock and a data clock in terms of the number of UIs and the read strobe code, a single UI of the UIs is a maximum extent of a fine delay adjustment provided by a receive delay locked loop and the number of UIs constitutes a coarse adjustment to the data clock, the read strobe code is the fine delay adjustment to the data clock having multiple steps and delays the data clock by less than the single UI;

receiving, by a receive delay locked loop, the difference;

delaying, by the receive delay locked loop, the data clock by the number of UIs and the read strobe code resulting in a delayed data clock that is calibrated to line up an edge of the delayed data clock with an edge of the reference clock; and sampling, by a sampling amplifier, to data from the memory based on the delayed data clock.

18. The method of claim 17, further comprising:

responsive to determining the memory is in idle mode, determining, by the controller circuitry, an updated read strobe code and an updated temperature of the memory; and responsive to determining the updated read strobe code at the updated temperature is not on an initial secondary slope line, adjust entries in a lookup table (LUT).

19. The method of claim 18, wherein the adjusting the entries in the LUT includes adjusting endpoints of the initial secondary slope line resulting in a corrected secondary slope line.

20. The method of claim 19, wherein the corrected secondary slope line goes through the updated read strobe code at the temperature.

* * * * *